United States Patent
Iy

(10) Patent No.: US 10,288,644 B2
(45) Date of Patent: May 14, 2019

(54) TEST SOCKET AND METHOD FOR TESTING A SEMICONDUCTOR PACKAGE

(71) Applicant: SAMSUNG ELECTRONICS CO., LTD., Suwon-si, Gyeonggi-do (KR)

(72) Inventor: Hyunguen Iy, Asan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 230 days.

(21) Appl. No.: 15/381,435

(22) Filed: Dec. 16, 2016

(65) Prior Publication Data
US 2017/0176493 A1 Jun. 22, 2017

(30) Foreign Application Priority Data
Dec. 18, 2015 (KR) .......................... 10-2015-0181875

(51) Int. Cl.
G01R 31/28 (2006.01)
G01R 1/04 (2006.01)
H01L 21/66 (2006.01)

(52) U.S. Cl.
CPC ............ G01R 1/0483 (2013.01); H01L 22/30 (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| | | | |
|---|---|---|---|
| 5,727,954 A * | 3/1998 | Kato | H01R 13/2421 439/66 |
| 6,083,013 A | 7/2000 | Yamagishi | |
| 6,093,035 A | 7/2000 | Lemke et al. | |
| 6,139,348 A | 10/2000 | Fukunaga | |
| 6,168,449 B1 * | 1/2001 | Huang | G01R 1/0483 439/259 |
| 6,824,411 B2 | 11/2004 | Ohshima | |
| 7,121,860 B2 | 10/2006 | Cram et al. | |
| 7,524,697 B2 | 4/2009 | Makihira et al. | |
| 7,601,018 B2 | 10/2009 | Hwang | |

FOREIGN PATENT DOCUMENTS

KR 10-1309695 B1 9/2017

\* cited by examiner

*Primary Examiner* — Tung X Nguyen
(74) *Attorney, Agent, or Firm* — Lee & Morse P.C.

(57) ABSTRACT

A test socket includes a base to receive a semiconductor package, an actuator in the base, the actuator including a through-hole, and a socket pin in the through-hole of the actuator, the socket pin contacting a terminal of the semiconductor package, wherein the socket pin includes a pin body, a pin head to contact the terminal of the semiconductor package, and an inclined portion inclined with respect to a longitudinal direction of at least an upper portion of the pin body, the pin head being connected to a top end of the inclined portion, and the pin body being connected to a bottom end of the inclined portion, wherein the inclined portion contacts at least a portion of an inner sidewall of the through-hole.

20 Claims, 9 Drawing Sheets

TEST SOCKET AND METHOD FOR TESTING A SEMICONDUCTOR PACKAGE

CROSS-REFERENCE TO RELATED APPLICATION

Korean Patent Application No. 10-2015-0181875, filed on Dec. 18, 2015, in the Korean Intellectual Property Office, and entitled: "Test Socket and Method for Testing A Semiconductor Package," is incorporated by reference herein in its entirety.

BACKGROUND

1. Field

Embodiments relate to a test socket and a method for testing a semiconductor package using the same.

2. Description of the Related Art

Semiconductor packages may be classified into normal products and abnormal products through various test processes, and thus reliability of products may be maintained. A burn-in test of these test processes may inspect an initial failure of a semiconductor package. A semiconductor package may be mounted on a test socket installed on a test substrate. The burn-in test may be performed on the semiconductor package mounted on the test socket.

SUMMARY

Embodiments may provide a test socket capable of automatically bringing a socket pin into contact with a terminal of a test semiconductor substrate by interaction between components.

Embodiments may also provide a test socket that can be easily manufactured. In an aspect, a test socket may include a base to receive a semiconductor package, an actuator in the base, the actuator including a through-hole, and a socket pin in the through-hole of the actuator, the socket pin contacting a terminal of the semiconductor package, wherein the socket pin includes a pin body, a pin head to contact the terminal of the semiconductor package, and an inclined portion inclined with respect to a longitudinal direction of at least an upper portion of the pin body, the pin head being connected to a top end of the inclined portion, and the pin body being connected to a bottom end of the inclined portion, wherein the inclined portion contacts at least a portion of an inner sidewall of the through-hole.

In another aspect, a method for testing a semiconductor package may include providing a socket pin penetrating an actuator disposed in a base, providing a cover covering a top end of the base, coupling the cover and the actuator to each other, compressing an elastic member disposed in the base by the cover to couple the cover to the base, providing a test semiconductor package into the base, and bring the socket pin into contact with a terminal of the test semiconductor package. The actuator may be vertically moved by elasticity of the elastic member, and the vertically moved actuator may come in contact with at least a portion of the socket pin to bring the socket pin into contact with the terminal.

In yet another aspect, a test socket includes an actuator in a base, the actuator including a through-hole, a socket pin to extend through the through-hole of the actuator toward a terminal of a semiconductor package on the base, the socket pin including an inclined portion inclined at an oblique angle with respect to a bottom of the base, the socket pin to contact at least a portion of an inner sidewall of the through-hole, wherein the actuator with the socket pin are moveable within the base along a direction orthogonal to the bottom of the base toward the terminal of the semiconductor package.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1A:
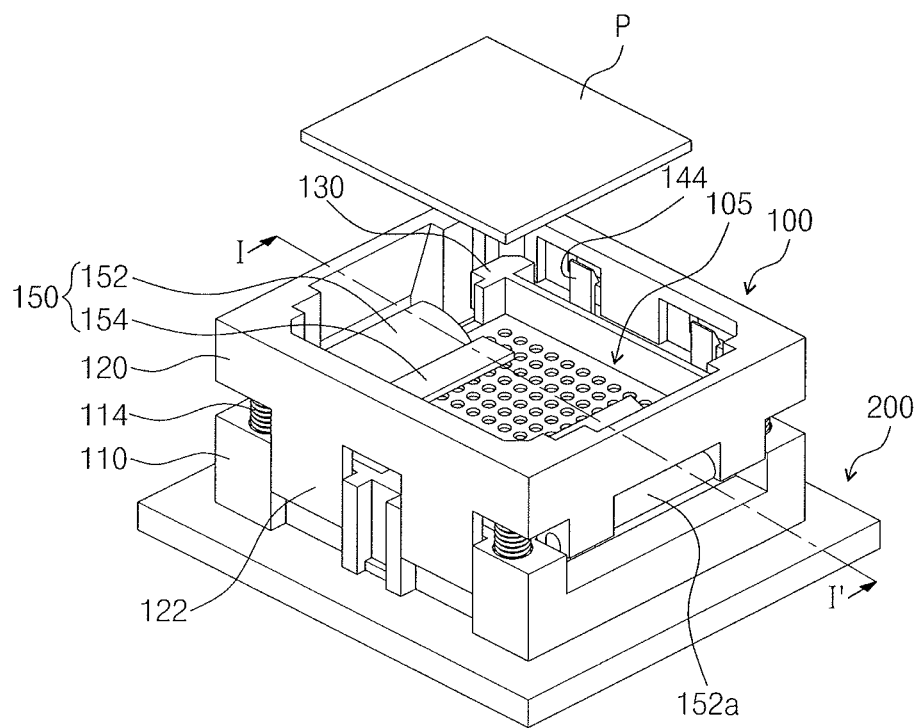
FIG. 1A illustrates a perspective view of a test system for testing a semiconductor package, according to some embodiments.

Exemplary embodiments explained and illustrated herein include their complementary counterparts. The same reference numerals or the same reference designators denote the same elements throughout the specification.

Figure 1B:
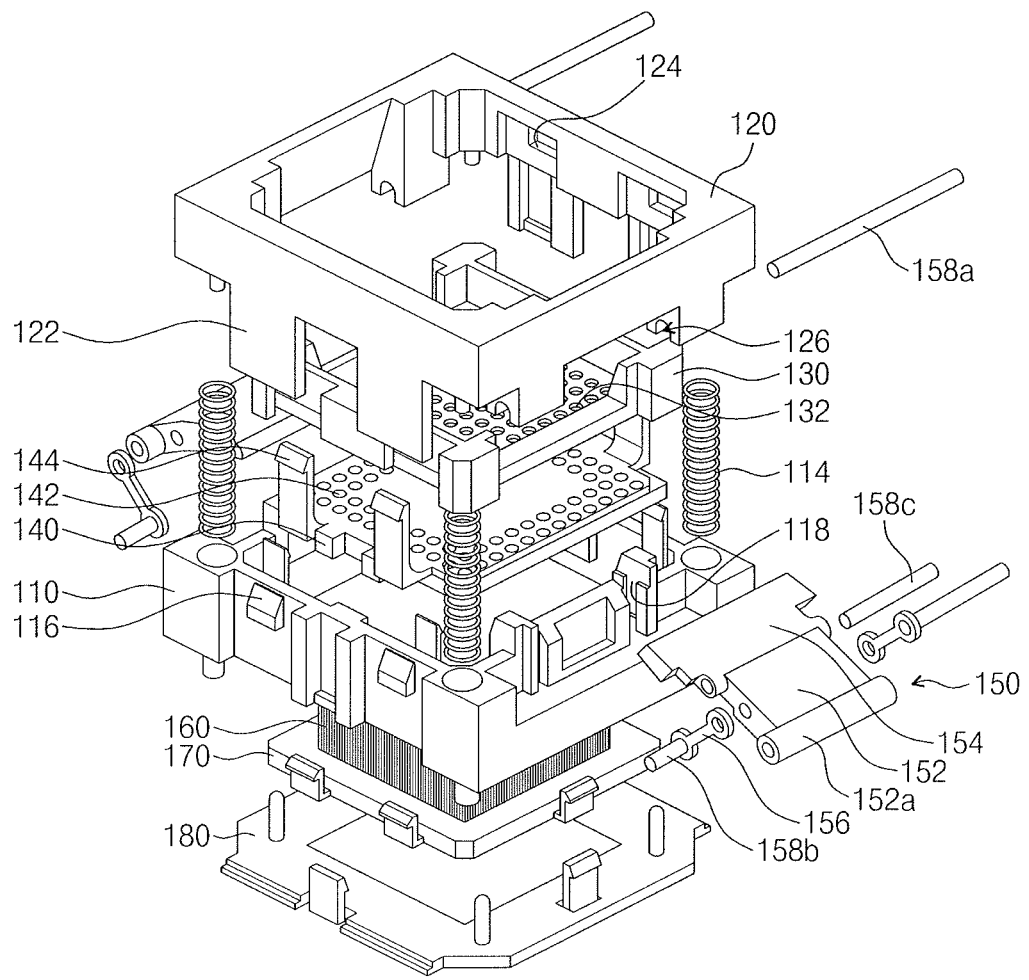
FIG. 1B illustrates an exploded perspective view of a test socket of FIG. 1A.
Figure 1C:
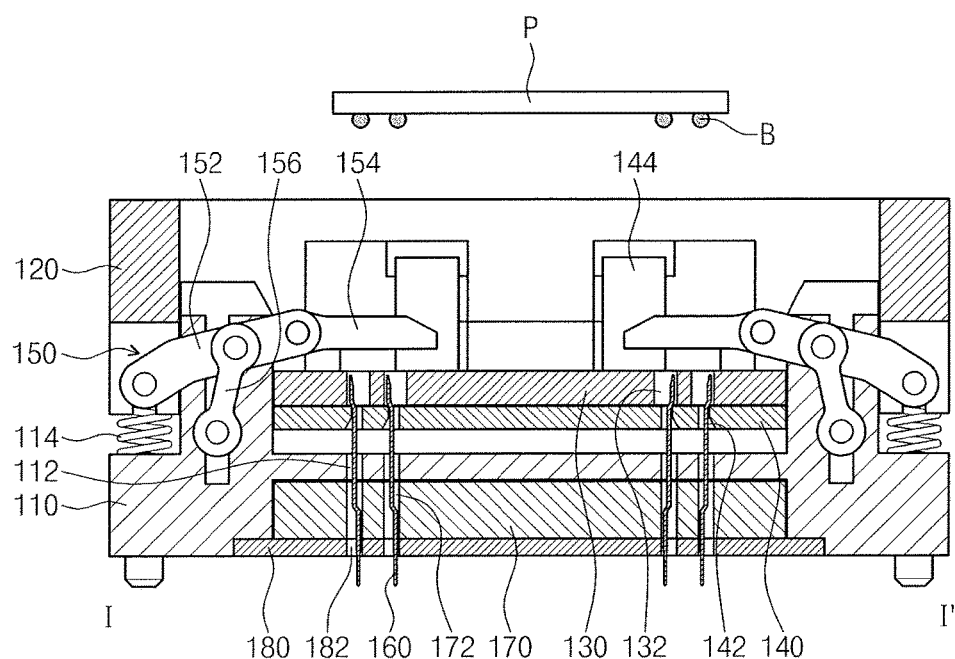
FIG. 1C illustrates a cross-sectional view taken along line I-I' of FIG. 1A.

FIG. 1A is a perspective view illustrating a test system 10 for testing a semiconductor package, according to some embodiments, and FIG. 1B is an exploded perspective view of a test socket 100 in the test system 10. FIG. 1C is a cross-sectional view taken along line I-I' of FIG. 1A. In FIGS. 1B and 1C, to clearly illustrate joint relationship between components, one or more components may be omitted, and some components may be exaggerated.

Referring to FIGS. 1A to 1C, the test system 10 for testing a semiconductor package may include the test socket 100 and a test substrate 200. The test socket 100 may be installed on the test substrate 200. A test semiconductor substrate P may be mounted on the test socket 100, and an electrical performance test may be performed on the test semiconductor substrate P.

Hereinafter, the test socket 100 and the test system 10 performing a burn-in test will be described as an example. However, embodiments are not limited to the burn-in test.

The test semiconductor substrate P may be a fine pitch-type package substrate or a semiconductor package. For example, the test semiconductor substrate P may have a pitch of 0.5 mm or less, e.g., the test semiconductor substrate P may have a pitch of 0.4 mm or less. In addition, the test semiconductor substrate P corresponding to a ball grid array (BGA) package using solder balls will be described as an example hereinafter. However, embodiments are not limited thereto, e.g., the test semiconductor substrate P may be one of various packages such as a thin small outline package (TSOP) and a land grid array (LGA) package. For example, when the test semiconductor substrate P is mounted on the test socket 100, terminals B of the test semiconductor substrate P (FIG. 1C) face, e.g., are inserted into, the test socket 100.

The test socket 100 may include a base 110, a cover 120, a floating adaptor 130, an actuator 140, a latch 150, a socket pin 160, a stopper 170, and a lead guide 180. The base 110 may be installed on the test substrate 200 and may have an inner space 105 receiving the test semiconductor substrate P. The base 110 may include first through-holes 112, elastic members 114, a first threshold part 116, and a guide 118. The socket pin 160 may be inserted in each of the first through-holes 112. The elastic members 114 may be provided at an edge portion (e.g., corner portions) of the base 110. The elastic members 114 may be compressed in a vertical direction. A first hook part 122 of the cover 120 may be coupled to the first threshold part 116. A second shaft 158b of the latch 150 may be coupled to the guide 118.

The cover 120 may be disposed on the base 110 and may be coupled to the base 110. The cover 120 may have a hollow structure, e.g., the cover 120 may have a frame structure surrounding an opening that exposes elements on the base 110. The cover 120 may include the first hook part 122, a second threshold part 124, and a shaft hole 126. The cover 120 may compress the elastic members 114 so as to be coupled to the base 110. For example, when the cover 120 is lowered toward the base 110, the elastic members 114 are compressed between the cover 120 and the base 110, and the first hook part 122, e.g., on an outer perimeter of the cover 120 and extending downwardly toward the base 110, is coupled to the first threshold part 116 of the base 110 so as to be fixed to each other, i.e., and to couple the cover 120 to the base 110. A second hook part 144 of the actuator 140 may be coupled to the second threshold part 124, e.g., on an inner perimeter, of the cover 120. A first shaft 158a of the latch 150 may be coupled to the shaft hole 126 of the cover 120.

The floating adaptor 130 may be disposed in the base 110, e.g., within a frame defined by the cover 120. The test semiconductor substrate P may be mounted on a top surface of the floating adaptor 130. The floating adaptor 130 may include terminal cups 132. Each of terminals B of the test semiconductor substrate P may be exposed through, e.g., extend into, each of the terminal cups 132. In some embodiments, each of the ball-shaped terminals B of the test semiconductor substrate P may be received, e.g., inserted, in each of the terminal cups 132. The socket pin 160 being in contact with the terminal B may be inserted in each of the terminal cups 132. The floating adaptor 130 may be vertically movable along, e.g., within, the cover 120.

The actuator 140 may be disposed in the inside, e.g., interior, of the base 110. The actuator 140 may include second through-holes 142 and the second hook part 144. The socket pin 160 may also be inserted in each of the second through-holes 142. The actuator 140 may be coupled to an inner sidewall of the base 110. For example, the second hook part 144 may be coupled to the second threshold part 124 of the cover 120. Thus, the actuator 140 may be vertically moved by vertical movement of the cover 120. The actuator 140 may be formed of an insulating material. Thus, even though the socket pin 160 is in contact with the actuator 140, the actuator 140 may not influence signal transmission between the test semiconductor substrate P and the test substrate 200.

The latch 150 may include a first body 152, a second body 154, a link 156, and shafts 158a, 158b, and 158c. A first end 152a of the first body 152 may be hinged to the cover 120, and a second end of the first body 152 may be coupled to the second body 154. The second body 154 may be in contact with the test semiconductor substrate P. A first end of the link 156 may be hinged to the base 110, and a second end of the link 156 may be coupled to the first body 152. When the cover 120 compresses the elastic members 114, the first end 152a of the first body 152 may be moved downwardly, i.e., thereby moving the second end of the first body 152 with the second body 154 upwardly, to open the latch 150. When the first end 152a of the first body 152 is released to move upward by the restoring force of the elastic members 114, i.e., the second end of the first body 152 with the second body 154 may be lowered, to close the latch 150. When the latch 150 is closed (after placing the test semiconductor substrate P on the floating adaptor 130), the second body 154 presses a top surface of the test semiconductor substrate P to a top surface of the floating adaptor 130 to fix the test semiconductor substrate P. The link 156 may be vertically moved by the movement of the first body 152 to assist the operation of the latch 150.

Here, referring to FIG. 1B, the first shaft 158a may be inserted through the shaft hole 126 of the cover 120 and through a hole in the first end 152a of the first body 152 to couple between the first end 152a of the first body 152 and the cover 120. The second shaft 158b may couple the link 156 and the first body 152 to each other, and the third shaft 158c may couple the first and second bodies 152 and 154 to each other.

Figure 2A:
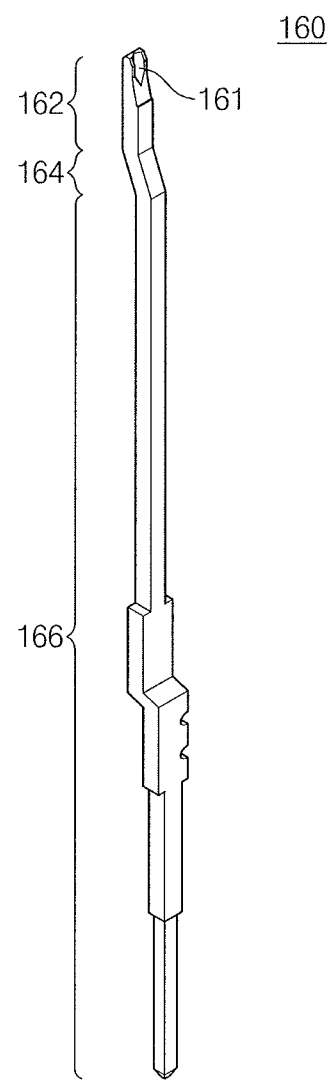
FIG. 2A illustrates a perspective view of a socket pin of FIGS. 1A to 1C.
Figure 2B:
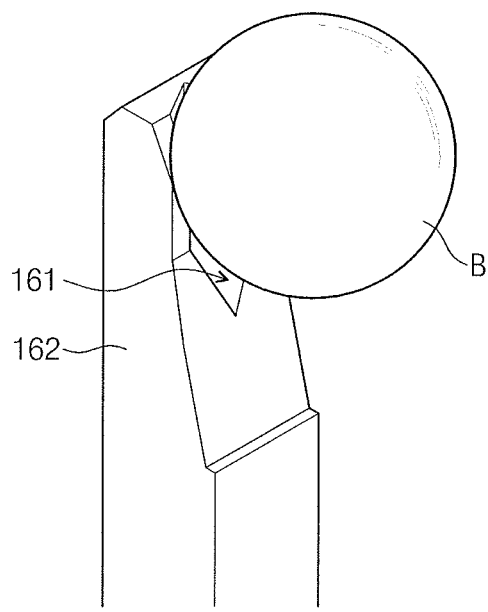
FIG. 2B illustrates an enlarged perspective view of a state in which a pin head of FIG. 2A is in contact with a terminal of a test semiconductor substrate.

FIG. 2A is a perspective view illustrating the socket pin 160 of FIGS. 1A to 1C. FIG. 2B is an enlarged perspective view illustrating a state in which a pin head 162 of FIG. 2A is in contact with the terminal B of the test semiconductor substrate P. The socket pin 160 may electrically connect the terminal B of the test semiconductor substrate P to a terminal (not shown) of the test substrate 200. Referring to FIGS. 2A and 2B, the socket pin 160 may include the pin head 162, an inclined portion 164, and a pin body 166.

In detail, the pin head 162 may correspond to an upper portion of the socket pin 160, i.e., to extend through the floating adaptor 130, and may be electrically connected to the test semiconductor substrate P, i.e., through the floating adaptor 130. In some embodiments, the pin head 162 may be in, e.g., direct, contact with the terminal B of the test semiconductor substrate P. The pin head 162 may include a recess portion 161 recessed toward the inside of the pin head 162. The recess portion 161 may increase a contact area between the ball-shaped terminal B and the pin head 162. For example, the pin head 162 may be in contact with a side portion of the terminal B. In other words, the socket pin 160 may be a pinch type.

The pin body 166 may have a substantially linear shape. An end (e.g., a bottom end) of the pin body 166 may be electrically connected to the terminal (not shown) of the test substrate 200. The inclined portion 164 may be inclined from the pin head 162 toward the pin body 166, e.g., at a non-zero angle in a longitudinal direction of at least an upper portion of the pin body 166. The inclined portion 164 may be connected between the pin head 162 and the pin body 166. In other words, a bottom end of the pin head 162 may be connected to a top end of the inclined portion 164, and a top end of the pin body 166 may be connected to a bottom end of the inclined portion 164. Due to the inclined portion 164, the pin head 162 may be laterally offset from a longitudinal central axis of the upper portion of the pin body 166. For example, as illustrated in FIG. 4D, the inclined portion 164 may connect the pin head 162 to the pin body 166 in such a way that a distance between the pin head 162 and a central axis L of the terminal B is greater than a distance between the pin body 166 and the central axis L of the terminal B. The central axis L may be an imaginary line that vertically passes through a center O of the terminal B.

The socket pin 160 may sequentially penetrate the floating adaptor 130, the actuator 140, the base 110, the stopper 170, and the lead guide 180 (FIG. 1C).

Figure 3:
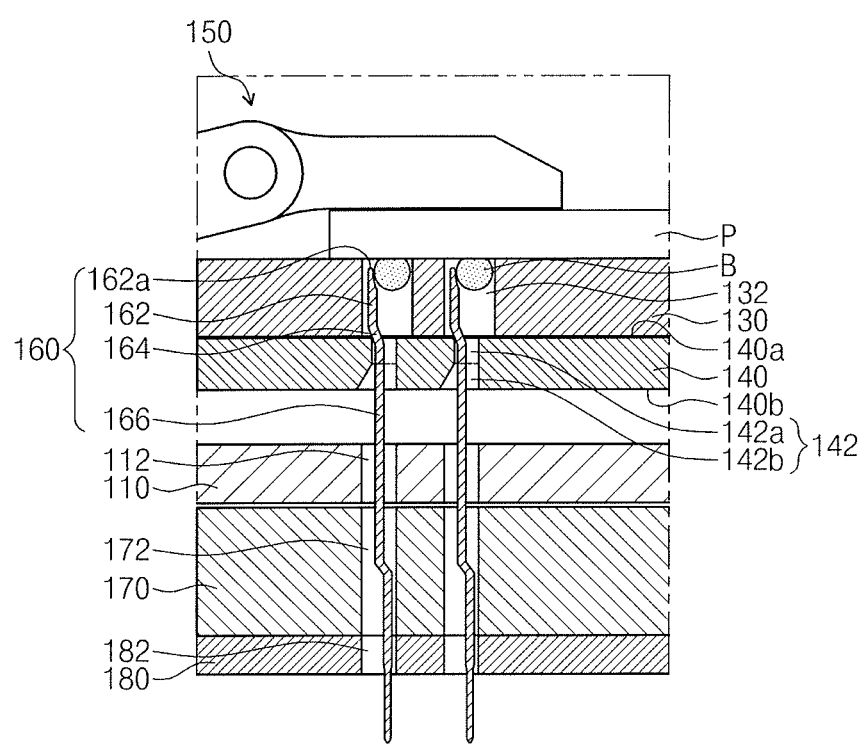
FIG. 3 illustrates a cross-sectional view of a state in which a socket pin is electrically connected to a terminal of a test semiconductor substrate.

FIG. 3 is a cross-sectional view illustrating a state in which the socket pin 160 is electrically connected to the terminal B of the test semiconductor substrate P. As illustrated in FIG. 3, each pin head 162 of the socket pin 160 may be in direct electrical connected with a corresponding terminal B of the test semiconductor substrate P inside a corresponding terminal cup 132 of the floating adaptor 130.

In detail, referring to FIG. 3, each of the second through-holes 142 may include a first portion 142a and a second portion 142b. The first portion 142a may be vertical, e.g., perpendicular, with respect to a surface of the actuator 140, and the second portion 142b may be inclined from the first portion 142a toward a surface of the actuator 140. For example, the second portion 142b may include at least one surface that is inclined with respect to at least one of a top surface 140a or a bottom surface 140b of the actuator 140. For example, an upper portion of the second through-hole 142 may correspond to the first portion 142a, e.g., the first portion 142a may extend from the top surface 140a, and a lower portion of the second through-hole 142 may correspond to the second portion 142b, e.g., the second portion 142b may extend from the bottom surface 140b. The second portion 142b may be inclined outward from the first portion 142a toward the bottom surface 140b. At least a portion of an inner sidewall of each of the second through-holes 142 may be in, e.g., direct, contact with the socket pin 160. For example, as illustrated in FIG. 3, at least a portion of an inner sidewall of the first portion 142a may be in, e.g., direct, contact with the socket pin 160.

Referring again to FIGS. 1A to 1C, the stopper 170 may be provided in, e.g., within, the base 110. The stopper 170 may include third through-holes 172. The socket pins 160 may be inserted in the third through-holes 172, and the stopper 170 may fix the socket pins 160. The lead guide 180 may be provided in, e.g., within, the base 110. The lead guide 180 may be provided under the stopper 170. The lead guide 180 may include fourth through-holes 182, e.g., the fourth through-holes 172 may be aligned with the first to third through-holes 112 to 172. The socket pins 160 may be inserted in the fourth through-holes 182. The lead guide 180 may protect the socket pins 160.

The test substrate 200 may be, e.g., a printed circuit board (PCB). An end (e.g., the bottom end) of the pin body 166 of FIG. 2A may be connected to the terminal of the test substrate 200. In some embodiments, the socket pin 160 may penetrate the test substrate 200, and a pin tail of the socket pin 160 may be exposed under the test substrate 200. A soldering process may be performed on an end of the exposed pin tail of the socket pin 160, and thus the socket pin 160 may be fixed at the test substrate 200.

FIGS. 4A to 4F are cross-sectional views illustrating an operation of electrically connecting the socket pin 160 to the terminal B of the test semiconductor substrate P.

Figure 4A:
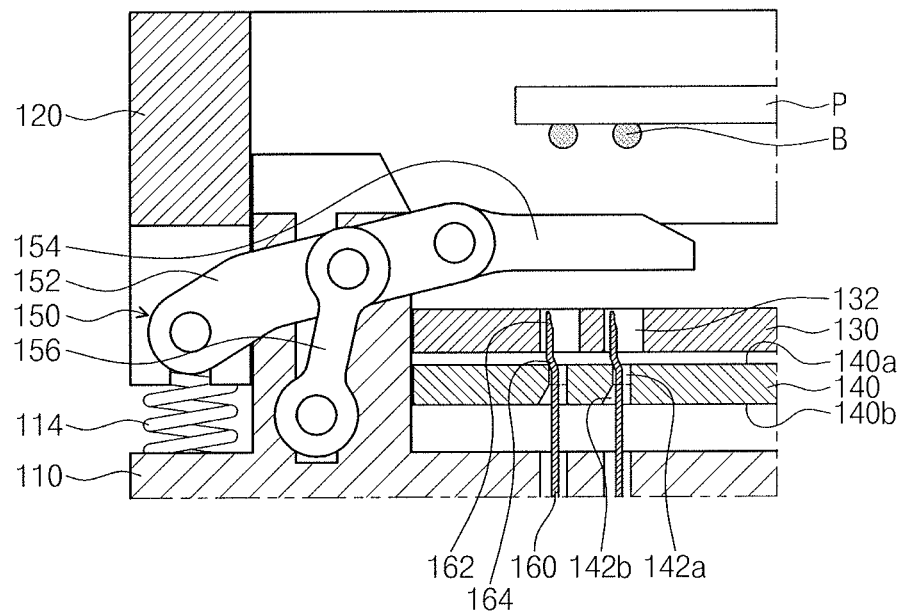
FIGS. 4A to 4F illustrate cross-sectional views of stages in an operation of electrically connecting a socket pin to a terminal of a test semiconductor substrate.

Referring to FIG. 4A, the socket pins 160 may be inserted through the bottom of the base 110 to penetrate through the first to fourth through-holes 112 to 182. It is noted that FIG. 4A illustrates the socket pins 160 through the second through-holes 142 of the actuator 140 disposed in the base 110, respectively. When the cover 120 is provided to cover the top end of the base 110, the actuator 140 may be coupled to the base 110.

Figure 4B:
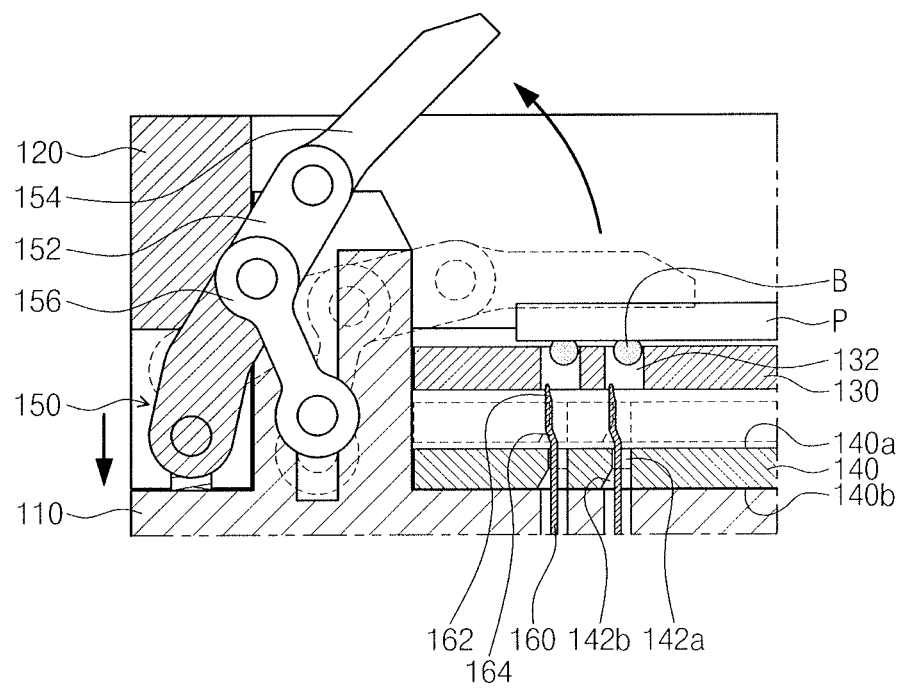

Referring to FIG. 4B, the elastic members 114 in the base 110 may be compressed by the cover 120. When the cover 120 compresses the elastic members 114, the first end of the first body 152 moves downwardly (along left arrow in FIG. 4B), and thus the first body 152 may be rotated upward (along right arrow in FIG. 4B) to pull the link 156 with the second body 154 (from the dashed position to the solid position in FIG. 4B) in order to open the latch 150 (along right arrow in FIG. 4B). At this time, the link 156 may be moved upward to assist the operation of the latch 150, e.g., facilitate pulling the first and second bodies 152 and 154 upward. After the latch 150 is opened, the test semiconductor substrate P may be loaded on the top surface of the floating adaptor 130. At this time, the terminals B of the test semiconductor substrate P may be received in the terminal cups 132 of the floating adaptor 130, respectively. The cover 120 may be pressed so as to be moved downward, and thus the actuator 140 may be moved downward.

Figure 4C:
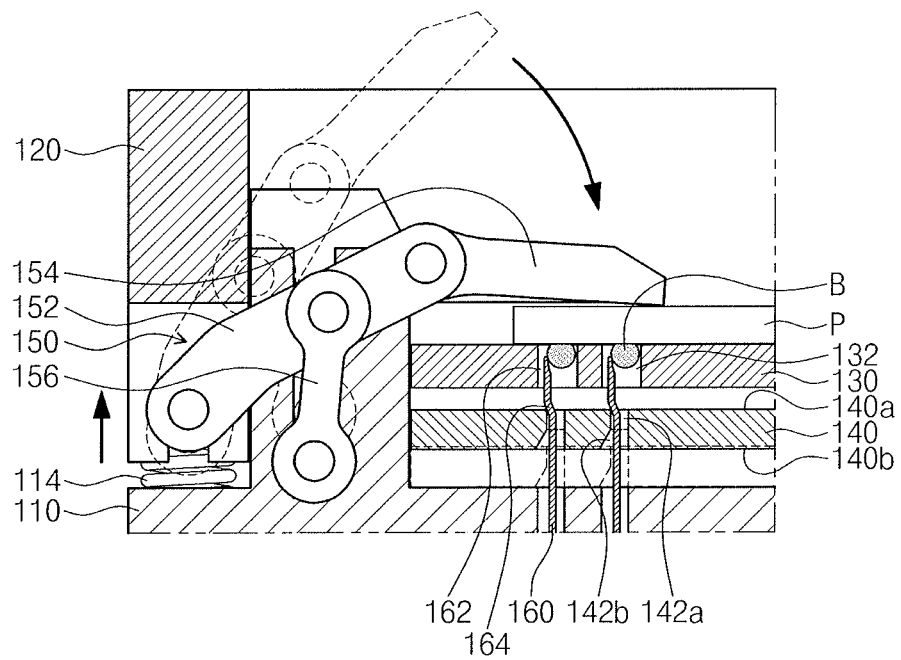
Figure 4D:
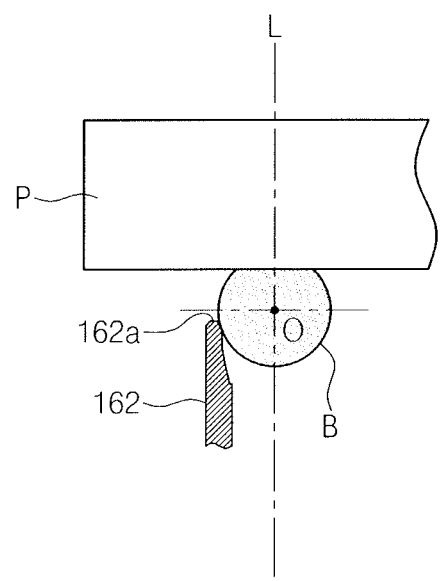

Referring to FIGS. 4C and 4D, the cover 120 may be moved upward by the restoring force of the elastic members 114. Thus, the first end of the first body 152 may be moved upward and the latch 150 may be closed. At least a portion of the second body 154 may come in contact with the test semiconductor substrate P and may press the test semiconductor substrate P.

Since the cover 120 is raised, the actuator 140 may also be raised. At this time, a portion of the actuator 140 may come in contact with the socket pin 160, e.g., the actuator 140 may push upwardly against the inclined part 164 of the socket pin 160 when raised. The actuator 140 may apply pressure to the socket pin 160 to bring the socket pin 160 into contact with the terminal B, e.g., the pressure of the actuator 140 against the inclined part 164 of the socket pin 160 may push the pin head 162 of the socket pin 160 into the terminal cup 132 to contact the terminal B. In detail, a top end of the inner sidewall of the first portion 142a of the second through-hole 142 of the actuator 140 may come in contact with the inclined portion 164 of the socket pin 160. The top end of the inner sidewall of the first portion 142a may press the inclined portion 164 upward. The top end of the inner sidewall of the first portion 142a may press the inclined portion 164 toward the center O of the terminal B. At this time, the pin head 162 may come in contact with a first place of the terminal B. For example, the first place of the terminal B may be a portion of a hemisphere disposed under the center O of the terminal B. In other words, the topmost portion 162a of the pin head 162 may be lower than the center O of the terminal B. Since the latch 150 presses the top surface of the test semiconductor substrate P, the test semiconductor substrate P may not be separated from the floating adaptor 130 even though the pin head 162 comes in contact with the portion of the terminal B lower than the center O of the terminal B.

Figure 4E:
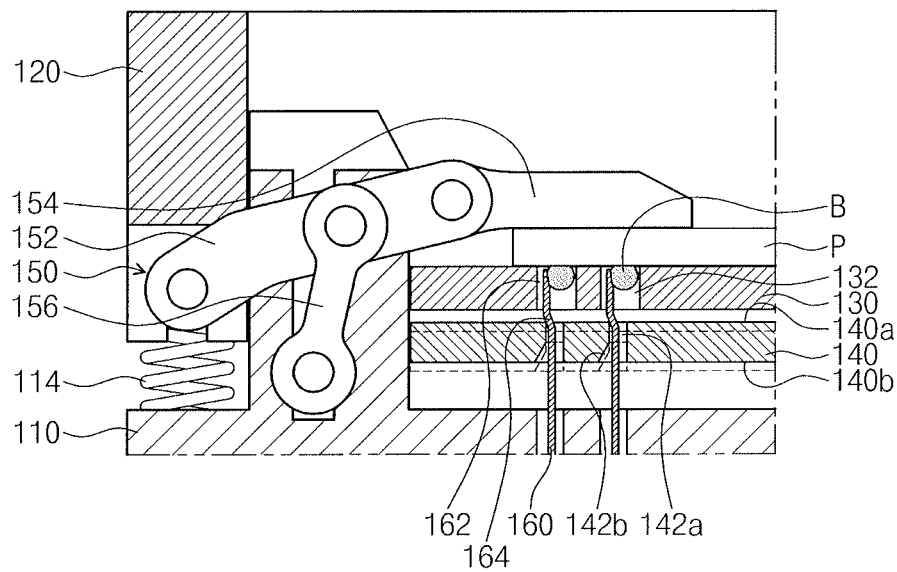
Figure 4F:
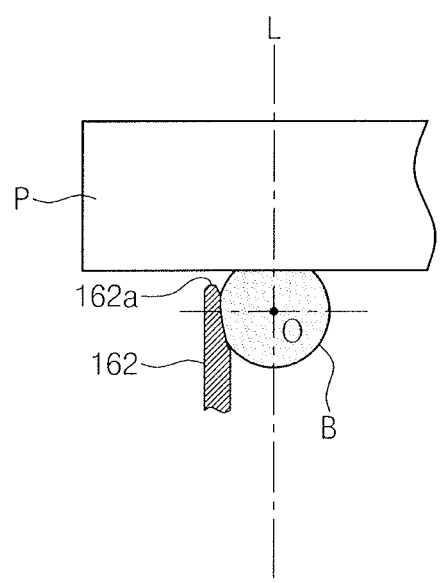

Referring to FIGS. 4E and 4F, the pressure of the cover 120 applied to the elastic members 114 may be released and the cover 120 may be coupled to the base 110. Thus, the upward movement of the first body 152 may be stopped and the second body 154 may press and fix the test semiconductor substrate P. The actuator 140 may be raised further together with the cover 120. At this time, a portion of the actuator 140 may be in contact with the socket pin 160. The actuator 140 may press the socket pin 160 further to bring the socket pin 160 into further contact with the terminal B. For example, the top end of the inner sidewall of the first portion 142a of the second through-hole 142 of the actuator 140 may be in contact with the inclined portion 164 of the socket pin 160 to have the first portion 142a press the inclined portion 164 farther upwardly. The top end of the inner sidewall of the first portion 142a may press the inclined portion 164 farther toward the center O of the terminal B. At this time, the pin head 162 may come in contact with a second place of the terminal B. For example, the second place of the terminal B may be a portion of a hemisphere disposed over, e.g., above, the center O of the terminal B. In other words, the topmost portion 162a of the pin head 162 may be higher than the center O of the terminal B. At this time, the pin head 162 may be moved from the first place to the second place in a state in which the pin head 162 is in contact with the terminal B. Since the contact between the socket pin 160 (i.e., the pin head 162) and the terminal B is performed in two steps, the contact of the socket pin 160 and the terminal B may be stably performed.

That is, according to embodiments, bringing the socket pin 160 into contact with the terminal B and fixing the test semiconductor package P may be completed at the same time. In other words, while placing and fixing the test semiconductor package P on the floating adaptor 130 with the latch 150, the socket pins 160 are simultaneously, i.e., during positioning and fixing of the test semiconductor package P, are connected to respective terminals B of the test semiconductor package P. As such, fixing of the test semiconductor package P and connecting the socket pins 160 to its terminals B may be simultaneously and automatically performed by the components of the test socket 100.

In the above embodiment, the first place of the terminal B is lower than the center O of the terminal B and the second place is higher than the center O of the terminal B. However, embodiments are not limited thereto. In certain embodiments, the first and second places may be disposed at other various positions, e.g., positions at different heights relative to the lead guide 180. In addition, even though not shown in the drawings, since the latch 150 presses the test semiconductor substrate P, the floating adaptor 130 may be moved downward.

According to some embodiments, the socket pin 160 may automatically come in contact with the terminal B of the test semiconductor substrate P by interaction of at least some of the cover 120, floating adaptor 130, the actuator 140, and the latch 150. In addition, since the socket pin 160 has a substantially linear shape, e.g., unlike a bow-type socket pin in which a plurality of components are arranged, the base 110 of one united body may be provided and the socket pin 160 may be automatically inserted in the components disposed in the base 110. Thus, the number of total components constituting the test socket 100 may be reduced and processes of manufacturing the test socket 100 may be simplified.

The above embodiments mainly describe the joint relationship between the components of the test socket 100. However, embodiments are not limited to the shapes and structures of the components of the test socket 100 described above. For example, the fixing parts and threshold parts coupling the components of the test socket 100 to each other may have shapes different from those illustrated in the drawings and/or may be disposed at positions different from those illustrated in drawings. In addition, in the above embodiments, the latch includes the first body coupled to one end of the cover, the second body coupled to the first body and coming in contact with the test semiconductor substrate, and the link coupled to the base and the first body. However, embodiments are not limited thereto. The latch may have one of other various structures and coupling relationships with the same function and operation as described in the above embodiments. Furthermore, the socket pin 160 may be driven by the interaction of the cover 120, the actuator 140, and the latch 150 in the above embodiments. However, embodiments are not limited thereto.

By way of summation and review, according to some embodiments, the socket pin may automatically come in contact with the terminals of the test semiconductor substrate (or the test semiconductor package) by the interaction between the components of the test socket. That is, the socket pin may come in contact with the terminal by the interaction of at least some of the cover, the floating adaptor, the actuator, and the latch. For example, the actuator and the latch coupled to the cover may be vertically moved by the vertical movement of the cover, so an inclined portion of a socket pin inserted through the actuator may be moved, e.g., pushed, by the vertical movement of the cover, i.e., the actuator, as well to contact the terminal. In addition, the socket pin may have a substantially linear shape, and thus the components may be united in the base and the socket pin may be automatically inserted in, e.g., through, the components. Thus, the number of total components of the test socket may be reduced and processes of manufacturing the test socket may be simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A test socket, comprising:
   a base to receive a semiconductor package;
   an actuator in the base, the actuator including a through-hole; and
   a socket pin in the through-hole of the actuator, the socket pin contacting a terminal of the semiconductor package,
   wherein the socket pin includes:
      a pin body,
      a pin head to contact the terminal of the semiconductor package, and
      an inclined portion inclined with respect to a longitudinal direction of at least an upper portion of the pin body, the pin head being connected to a top end of the inclined portion, and the pin body being connected to a bottom end of the inclined portion,
      wherein the inclined portion contacts and overhangs at least a top edge of an inner sidewall of the through-hole.

2. The test socket as claimed in claim 1, wherein the through-hole includes:
   a first portion vertical with respect to a surface of the actuator; and
   a second portion inclined from the first portion toward the surface of the actuator, a widest width of the second portion being larger than a widest width of the first portion.

3. The test socket as claimed in claim 2, wherein at least a portion of an inner sidewall of the first portion contacts the inclined portion.

4. The test socket as claimed in claim 1, wherein the pin body has a substantially linear shape.

5. The test socket as claimed in claim 1, further comprising:
a cover covering a top end of the base; and
an elastic member between the cover and the base, wherein the cover compresses the elastic member and is coupled to the base.

6. The test socket as claimed in claim 5, wherein the actuator is coupled to a side of the cover.

7. The test socket as claimed in claim 6, further comprising a floating adaptor in the base and including a terminal cup to receive the terminal of the semiconductor package.

8. The test socket as claimed in claim 7, further comprising a latch coupled to a side of the cover to fix the semiconductor package on the floating adaptor.

9. The test socket as claimed in claim 1, wherein the pin head includes a recess portion recessed toward an inside of the pin head.

10. A method for testing a semiconductor package, the method comprising:
providing a socket pin penetrating an actuator in a base;
providing a cover covering a top end of the base;
coupling the cover and the actuator to each other;
compressing an elastic member in the base by the cover to couple the cover to the base;
providing a test semiconductor package into the base; and
bringing the socket pin into contact with a terminal of the test semiconductor package,
wherein the actuator is vertically moved by elasticity of the elastic member, and the vertically moved actuator contacts at least a portion of the socket pin to bring the socket pin into contact with the terminal.

11. The method as claimed in claim 10, wherein the actuator coupled to the cover is lowered when the cover compresses the elastic member, the actuator is raised by a restoring force of the elastic member to press the socket pin.

12. The method as claimed in claim 11, wherein bringing the socket pin into contact with the terminal includes:
bringing the socket pin into contact with a first place of the terminal; and
moving the socket pin from the first place to a second place of the terminal in a state in which the socket pin is in contact with the terminal,
wherein the second place is different from the first place.

13. The method as claimed in claim 12, wherein the terminal has a ball shape, the first place being a portion of a hemisphere under a center of the terminal, and the second place being a portion of a hemisphere above the center of the terminal.

14. The method as claimed in claim 11, wherein:
a latch coupled to the cover is opened when the cover compresses the elastic member, and then the test semiconductor package is provided into the base, and
when pressure applied to the elastic member is released, the latch is closed to press and fix the test semiconductor package.

15. The method as claimed in claim 14, wherein bringing the socket pin into contact with the terminal and fixing the test semiconductor package are completed at the same time.

16. A test socket, comprising:
an actuator in a base, the actuator including a through-hole; and
a socket pin to extend through the through-hole of the actuator toward a terminal of a semiconductor package on the base, the socket pin including an inclined portion inclined at an oblique angle with respect to a bottom of the base, the socket pin to contact at least a portion of an inner sidewall of the through-hole,
wherein the actuator with the socket pin are moveable within the base along a direction orthogonal to the bottom of the base toward the terminal of the semiconductor package.

17. The test socket as claimed in claim 16, wherein the inclined portion of the socket pin contacts at least partially a top edge of the inner sidewall of the through-hole, the actuator being moveable against the inclined portion to push the socket pin upward.

18. The test socket as claimed in claim 16, further comprising:
a cover coupled to the base via an elastic member, the actuator being coupled to a first side of the cover; and
a latch coupled to a second side of the cover, the latch and actuator being vertically moveable with the cover.

19. The test socket as claimed in claim 18, wherein a first end of the latch is coupled to the cover, and a second end of the latch secures the semiconductor package in the base, the latch being rotatable around the first end thereof.

20. The test socket as claimed in claim 18, wherein the cover, the actuator, and the socket pin are simultaneously moveable in a same direction.

* * * * *